(12) United States Patent
Kenawy et al.

(10) Patent No.: US 11,055,625 B2
(45) Date of Patent: Jul. 6, 2021

(54) QUANTUM BITS BY ELECTROSTATIC GATING SUPERCONDUCTING RINGS

(71) Applicants: IMEC vzw, Leuven (BE); Katholieke Universiteit Leuven, Leuven (BE)

(72) Inventors: Ahmed Kenawy, Leuven (BE); Bart Soree, Begijnendijk (BE); Wim Magnus, Onze-Lieve-Vrouw-Waver (BE)

(73) Assignees: IMEC vzw, Leuven (BE); Katholieke Universiteit Leuven, Leuven (BE)

(*) Notice: Subject to any disclaimer, the term of this patent is extended or adjusted under 35 U.S.C. 154(b) by 0 days.

(21) Appl. No.: 16/289,345

(22) Filed: Feb. 28, 2019

(65) Prior Publication Data

US 2020/0279184 A1    Sep. 3, 2020

(51) Int. Cl.
*G06N 10/00* (2019.01)
*H01L 39/22* (2006.01)

(52) U.S. Cl.
CPC .......... *G06N 10/00* (2019.01); *H01L 39/228* (2013.01)

(58) Field of Classification Search
CPC ...... G06N 10/00; H01L 39/228; H01L 39/146
See application file for complete search history.

(56) References Cited

U.S. PATENT DOCUMENTS

2009/0079494 A1    3/2009    Kerner et al.

OTHER PUBLICATIONS

Kulik et al. quantum Computational Gates with Radiation Free Coupling, ArXiv:cond Mar. 14, 2002 (Year: 2002).*
Bonsor et al., Howstuffworks, "How Quantum Computers Work"; https://computer.howstuffworks.com/quantum-computer.htm/ printable, retrieved Aug. 7, 2020.
A. Kenawy, W. Magnus, and B. Sorée, "Flux quantization and Aharonov-Bohm effect in superconducting rings," *Journal of Superconductivity and Novel Magnetism* 31, 1351-1357 (2018).
C. Kerner et al., "Control and readout of current-induced magnetic flux quantization in a superconducting transformer," *Superconductor Science and Technology* 22, 025001 (2009).

* cited by examiner

*Primary Examiner* — Matthew L Reames
(74) *Attorney, Agent, or Firm* — Knobbe, Martens, Olson & Bear, LLP (57) ABSTRACT

The disclosed technology generally relates to superconducting devices, and more particularly to superconducting rings, qubits comprising the superconducting rings and methods of coherently coupling flux states of the superconducting rings. In one aspect, a qubit includes a superconducting ring around a hole. The qubit additionally includes an electric field generator adapted for applying an electric field in a plane of the superconducting ring over at least part of the superconducting ring, and a magnetic field generator adapted for applying a magnetic field component orthogonal to the plane of the superconducting ring such that the magnetic field component at least crosses the hole of the ring.

11 Claims, 6 Drawing Sheets

QUANTUM BITS BY ELECTROSTATIC GATING SUPERCONDUCTING RINGS

BACKGROUND

Field

The disclosed technology generally relates to superconducting devices, and more particularly to superconducting rings, qubits comprising the superconducting rings and methods of coherently coupling flux states of the superconducting rings.

Description of the Related Technology

The disclosed technology relates to the field of quantum computing. Among the various physical realization of quantum bits, or qubits—the fundamental building block of a quantum computer—superconducting qubits may be among the major scalable platform. The quantization of magnetic flux in superconductors lies at the heart of realizing quantum bits, using superconducting circuits.

Figure 1:
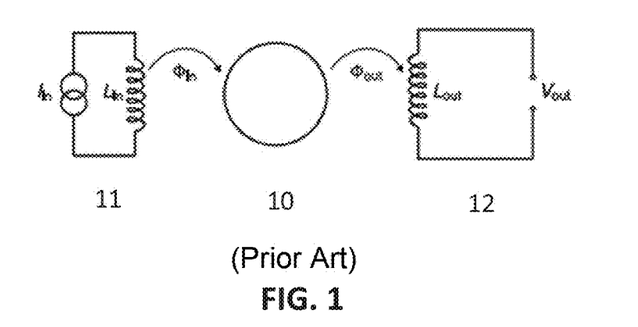
FIG. 1 shows a control and readout structure for a qubit ring.

A qubit was proposed in C. Kerner et al., "Control and readout of current-induced magnetic flux quantization in a superconducting transformer," *Superconductor Science and Technology* 22, 025001 (2009). The proposed structure includes a central superconducting ring flux biased by an input loop. The flux state of the central ring is read out by a third output ring. Furthermore, to suppress crosstalk between the input and the output rings, permalloy cores can be employed to guide the magnetic flux. An equivalent circuit of the proposed structure is depicted in FIG. 1 illustrating an input ring 11, a qubit ring 10 and an output ring 12.

Figure 2:
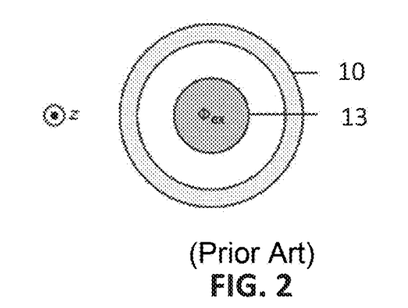
FIG. 2 shows a schematic drawing of a superconducting ring threaded by a cylindrical core to which an external magnetic field $\varphi_{ex}$ is confined.

The fundamental principle governing the operation of this structure is the quantization of magnetic flux in superconducting rings. When a superconducting ring is placed in an external magnetic field, current flows to expel the field from the bulk of the ring and to ensure that the enclosed flux is an integer multiples of the flux quantum $\Phi=h/(2|e|)$ where h is Planck's constant and e is the electronic charge. Accordingly, one can characterize the state of the ring by the number of flux quanta threading it, e.g. $|0>$; $|1>$; $|2>$; etc. An example of such a superconducting ring 10 is illustrated in FIG. 2. It shows the top view of the superconducting ring 10 threaded by a cylindrical core 13, to which the external magnetic field $\varphi_{ex}$ is confined.

A superconducting ring can only act as a qubit if it can be in a superposition state:

$$|\psi>=\alpha|0>+\beta|1>.$$

In other words, to construct a flux qubit, one must coherently couple the flux states of a superconducting ring. In some technologies, this is achieved by breaking the rotational symmetry of the ring. Established implementations can lead to an inherently broken symmetry by interrupting the superconducting ring with an insulating barrier; hence, forming a Josephson junction, giving rise to the flux qubit. However, these implementations are plagued by the variability of the fabrication process of the junction. Such insulating barriers may for example be formed using an oxidation process which is susceptible to variability. Moreover, once an insulating barrier is formed, tuning the thickness of the insulating barrier is not possible anymore. In some Josephson junctions, tuning of the transition frequency of the qubit are typically done by applying a magnetic field to the qubit, which can result in magnetic noise in the system.

In other technologies, a qubit is implemented as a phase-slip qubit wherein the superconducting loop is interrupted with a constriction, sometimes in the form of a nanowire.

The common ground of these implementations is that an interruption of the rotational symmetry of the ring is obtained by either an insulating barrier or another interruption. These implementations are, however, can be plagued by the variability of the fabrication process. In view of these problems there is therefore a need for alternative qubits and methods for controlling such structures.

SUMMARY OF CERTAIN INVENTIVE ASPECTS

It is an object of embodiments of the disclosed technology to provide a good qubit and a method for controlling such a qubit.

The above objective is accomplished by a method and device according to the disclosed technology.

In a first aspect embodiments of the disclosed technology relate to a qubit comprising:
  a superconducting ring around a hole,
  an electric field generator adapted for applying an electric field in a plane of the superconducting ring over at least part of the superconducting ring,
  a magnetic field generator adapted for applying a magnetic field component orthogonal to the plane of the superconducting ring such that it at least crosses the hole of the ring.

It is an advantage of embodiments of the disclosed technology that coupled flux states can be obtained by applying an electric field in a plane of the ring over at least part of the ring.

Since the Josephson junction is omitted, a qubit according to embodiments of the disclosed technology is less prone to process variability than a qubit comprising an insulating barrier in the superconductive ring. Hence, longer coherence times can be obtained in qubits according to embodiments of the disclosed technology. This is especially important when building a large-scale quantum computing device using qubits in accordance with embodiments of the disclosed technology.

Moreover, the ability to modulate the transition frequency of the qubit by changing the electric field is a desired quality since it allows for less sensitivity to magnetic noise; thus, longer coherence times.

In embodiments of the disclosed technology the electric field generator comprises a first gate, and a second gate. The first gate and the second gate are positioned such that at least a part of the superconducting ring is located between the first gate and the second gate. The electric field generator is, moreover, adapted for applying a bias voltage between the first and the second gate.

It is an advantage of embodiments of the disclosed technology that an electric field can be applied in a plane of the superconducting ring by biasing the first and second gate.

In embodiments of the disclosed technology the first gate is located at a first outer side of the superconducting ring and the second gate is located at a second outer side of the superconducting ring.

In embodiments of the disclosed technology the first gate is located inside the superconducting ring and the second gate is located outside the superconducting ring.

By positioning the first gate inside the superconducting ring and the second gate outside the superconducting ring it is possible to reduce the required bias voltage to obtain coupled flux states in the qubit. This is possible because the first and second gate can be positioned closer to each other than when both are outside the superconducting ring.

In embodiments of the disclosed technology the electric field generator is adapted for tuning the applied electric field.

It is an advantage of embodiments of the disclosed technology that the transition frequency of the qubit can be modulated by tuning the applied electric field.

In embodiments of the disclosed technology the superconducting ring is circular.

In embodiments of the disclosed technology a thickness between the inside and the outside of the superconducting ring is smaller than or equal to a Ginzburg-Landau coherence length of the superconducting ring.

It is an advantage of embodiments of the disclosed technology that the gate voltage required to locally reduce the superconductivity is reduced by reducing the thickness of the superconducting ring. The thickness of the ring may for example be reduced to a size smaller than or equal to the Ginzburg-Landau coherence length of the superconducting ring.

In embodiments of the disclosed technology the superconducting ring comprises a type I superconductor.

In embodiments of the disclosed technology the qubit comprises a magnetic core through the hole of the superconducting ring wherein the magnetic field generator is adapted for confining the magnetic field in the magnetic core.

Embodiments of the disclosed technology relate to a qubit structure comprising a plurality of qubits in accordance with embodiments of the disclosed technology. The qubits are thereby organized in an array.

It is an advantage of embodiments of the disclosed technology that the qubits which are organized in the array can communicate with each other. By tuning the individual qubits it is possible to determine which qubits can communicate with each other.

In embodiments of the disclosed technology a qubit structure comprises a plurality of arrays and the qubits of different arrays are stacked on top of each other.

In embodiments of the disclosed technology the gates of the qubits which are stacked on top of each other are interconnected thereby forming pillars of first gates and pillars of second gates.

Embodiments of the disclosed technology relate to a quantum computing device comprising qubits according to embodiments of the disclosed technology and/or a qubit structure according to embodiments of the disclosed technology.

In a second aspect embodiments of the disclosed technology relate to a method of generating coupled flux states in a superconducting ring, the method comprising applying a magnetic field component orthogonal to the ring and at least crossing the ring hole and applying an electrical field in a plane of the superconducting ring over at least part of the ring.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the disclosed technology, the only relevant components of the device are A and B.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the disclosed technology reference is made to a ring structure, reference is made to a closed structure in which a closed current path is possible, and which has only one hole. Such a structure may for example have an elliptical, polygonal (e.g. square), or circular cross-section. It may have rounded corners. Such a structure may for example have a torus or doughnut like shape.

A first aspect embodiments of the disclosed technology relate to a qubit which uses electrostatic gating of the superconductor as an alternative to using Josephson junctions. In embodiments of the disclosed technology, the effect of the insulating barrier is achieved by applying a static electric field in the plane of the superconducting ring.

Thus, a junctionless flux qubit is obtained, comprising a voltage-gated superconducting ring. The in-plane electric field, arising from the gate voltage, is applied locally to suppress the density of superconducting electrons, thereby imitating the effect of interrupting the superconductor with an insulator. Furthermore, the proposed qubit allows for electric-tunability of the transition frequency, which can be a desired feature for multi-qubit systems, rendering the circuit less sensitive to magnetic noise. Electrically-tunable flux qubits with long coherence times, according to embodiments of the disclosed technology, pave the road towards the long-sought goal of scaling up superconducting quantum computers.

A qubit 100 according to embodiments of the disclosed technology comprises a superconducting ring 110, an electric field generator 120 adapted for applying an electric field in a plane of the superconducting ring 110 over at least part of the superconducting ring 110, and a magnetic field generator adapted for applying a magnetic field component orthogonal to the plane of the superconducting ring 110. The applied magnetic field component should at least cross the hole of the ring. In embodiments of the disclosed technology, at least a component of the magnetic field is orthogonal to the plane of the ring. In some embodiments the magnetic field as a whole may be substantially orthogonal to the plane of the ring.

In embodiments of the disclosed technology, the magnetic field generator may comprise a solenoid core that pierces the ring for applying a magnetic field component that is perpendicular to the plane of the ring. The solenoid core may be substantially orthogonal to the plane of the ring resulting in a magnetic field that is substantially orthogonal to the plane of the ring.

Figure 3:
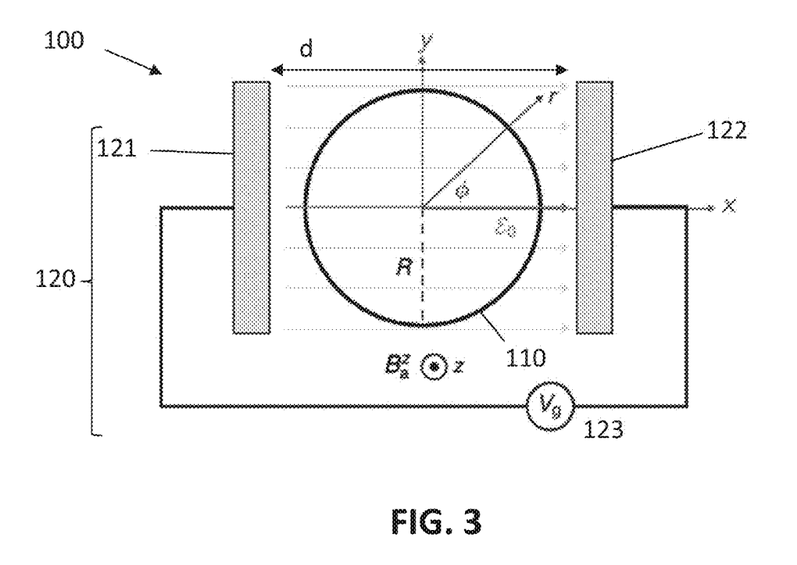
FIG. 3 shows a schematic drawing of a qubit which comprises a superconducting ring and which is adapted for applying an in-plane electric field to the superconducting ring and which is adapted for applying a magnetic field perpendicular to the ring, in accordance with embodiments of the disclosed technology.

In embodiments of the disclosed technology the electric field generator 120 may be adapted for applying the electric field uniformly over the superconductive ring (see, for example, FIG. 3). The electric field generator may therefore comprise a first gate 121 at one outer side of the ring and a second gate 122 at an opposite outer side of the ring. Thus, a parallel-plate capacitor structure is obtained that surrounds the ring. By applying a gate voltage on these gates, a uniform electric field is generated over the superconductive ring. This may be achieved using a voltage source 123.

Figure 5:
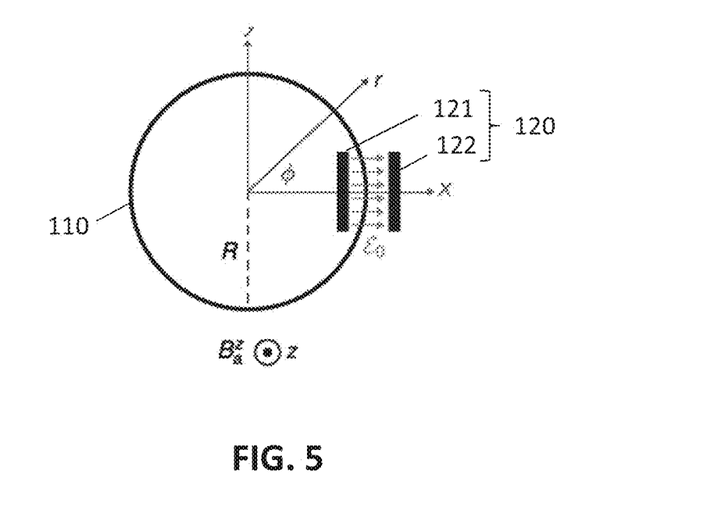
FIG. 5 is a schematic drawing of a qubit, wherein the electric field generator is adapted for applying the electric field over part of the ring, in accordance with embodiments of the disclosed technology.

In embodiments of the disclosed technology, the electric field generator 120 may be adapted for applying the electric field over part of the ring (see, for example, FIG. 5). Such an electric field generator may comprise a first gate 121 at an inner side of the ring and a second gate 122 at an outer side of the ring. By applying a gate voltage on these gates, a local electric field is generated that only affects a small part of the ring. In embodiments of the disclosed technology, the gate is made of conductive material. The gates may, for example, be made of a metal. The gates may for example be metal lines.

Depending on the thickness between the inside and the outside of the superconducting ring 110, a different electric field may be applied. The thickness of the ring is preferably as thin as possible because it allows to reduce the applied bias voltage between a first gate 121 and a second gate 122 of the qubit. The applied bias voltage may, for example, range from tens of millivolts to tens of volts. Depending on the positions of the first gate and the second gate, the applied bias voltage may be different. When the first gate is inside the ring and the second gate is outside the ring they can be positioned closer to each other than when both gates are outside the superconducting ring. Therefore, the applied bias voltage may be smaller when the first gate is inside the superconducting ring.

In principal, there is no limitation on the size of the ring because what matters is the ratio of the dimensions to the characteristic lengths of the superconductor used, namely the London penetration depth $\lambda_L$ and the Ginzburg-Landau (GL) coherence length $\xi_{GL}$.

By reducing the size of the loop, the noise accumulation in the loop and the require bias voltage can be reduced. The radius of a qubit in accordance with embodiments of the disclosed technology may be in the range of tens of nanometers, e.g., up to about 100 nanometer, e.g., about 16 nm. A qubit in accordance with embodiments of the disclosed technology may for example be fabricated using deep EUV lithography.

As is known by the person skilled in the art the superconducting ring 110 is obtained by cooling the ring below a critical temperature $T_c$, which is dependent on the material of the ring. The superconducting ring may for example comprise a Type I superconductor. Type I superconductor materials include, for example, aluminum, niobium, lead, and tantalum.

The basic working principal of the technology is to imitate the suppression of superconductivity in the insulating barrier of a Josephson junction, which is used form a qubit in most technologies, by the applied electric field. Since there is no need for an oxidation process to form the Josephson junction, the disclosed technology does not suffer from process variability as current implementations of qubits. Moreover, the transition frequency of the qubit can be tuned by modulating the applied electric field through the gate voltage Vg. The frequency may for example be in the GHz range, e.g. up to hundreds of GHz.

Without being bound by any theory, in the following paragraphs it is explained why a plain superconducting ring pierced by a core to which an external magnetic field is confined, as illustrated in FIG. 2, does not behave as a qubit. Next it is explained how an in-plane electric field, in accordance with embodiments of the disclosed technology, can be used to break the cylindrical symmetry of the wave function of superconducting electrons. Thus, a qubit can be obtained by applying such an in-plane electric field over the superconducting ring or over part of the superconducting ring. In the theoretical explanation given below the ring is a circular ring. The ring is, however, not limited to this circular shape.

To study the evolution of the density of superconducting electrons in response to a time-varying magnetic field, the time-dependent Ginzburg-Landau (GL) equations are employed with the state of a superconductor described by the complex order parameter $\psi$ and the density of superconducting electrons $n_s=|\psi|^2$.

The two coupled GL equations can be numerically solved using a finite-difference scheme. The theoretical description of the ring along with the main results were published in A. Kenawy, W. Magnus, and B. Sorée, "Flux quantization and Aharonov-Bohm effect in superconducting rings," *Journal of Superconductivity and Novel Magnetism* 31, 1351-1357 (2018). A key conclusion is that, as the applied magnetic flux increases in time, the number of flux quanta threading the ring increases in integer steps, which corresponds to a $2\pi$ jump in the phase of the order parameter w. Furthermore, the transition between flux states requires the formation of a vortex, or more generally, breaking the cylindrical symmetry of the order parameter in the ring. A vortex is a local destruction of superconductivity occurring over a length scale characterized by the GL coherence length $\xi_{GL}$. Moreover, the density of superconducting electrons vanishes at the center of the vortex and Cooper pairs break up into normal electrons. In other words, the only way to change the flux state of the ring is by driving part of the ring into the normal state. Importantly, since vortex formation is a dissipative process—due to the Joule heating of normal electrons—one cannot coherently couple successive flux states to achieve a superposition state. Consequently, a plain superconducting ring does not behave as a qubit.

Prior art realizations of superconducting qubits guarantee an inherently broken symmetry by interrupting the superconducting ring with an insulating barrier; hence, forming a Josephson junction. Intuitively, one can visualize the vortex tunnelling in and out through the insulator without affecting superconductivity. Other proposals include using a constriction in the ring, e.g., a superconducting nanowire giving rise to phase-slip qubits.

In embodiments of the disclosed technology, on the other hand, an in-plane electric field is employed to break the cylindrical symmetry of the wave function of superconducting electrons.

Figure 4:
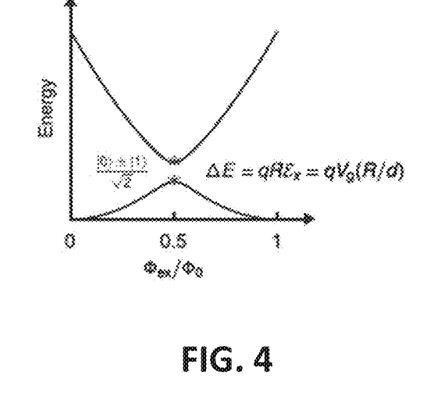
FIG. 4 is a schematic graph showing the energy spectrum as a function of the applied magnetic field for the superconducting ring of FIG. 3, illustrating the coupled states, in accordance with embodiments of the disclosed technology.

FIG. 3 shows a schematic drawing of a qubit 100 which uses in-plane gating of a superconducting ring. This experimental setup comprises a magnetic field generator for applying a magnetic field component $B_a^z$ orthogonal to the plane of the ring (only the resulting magnetic field component is shown for simplicity of the drawing). In embodiments of the disclosed technology, the superconducting ring may be pierced by a cylindrical core, to which the external magnetic field is confined. By applying an external flux biased ($\Phi_{ex}=0.5\Phi_0$ the angular momentum states |0> and |1> are degenerate. An in-plane electric field can be applied by the electric field generator 120. In this example the electric field generator 120 comprises a first gate 121 at a first outer side of the ring 110 and a second gate 122 at a second outer side of the ring, opposite to the first outer side, such that the ring is between the first gate and the second gate. The in-plane electric field, arising from the gate voltage, breaks the symmetry of the ring and allows for coupling the states |0> and |1>. The resultant energy spectrum is shown in FIG. 4, where at the degeneracy point, the eigenstates are the symmetric and anti-symmetric superpositions with an energy separation $\Delta E=qREx$, where q is the charge of a Cooper pair, R is the radius of the loop and Ex is the electric field along the x-direction (the direction orthogonal to the gates).

Since the classical GL equations are insufficient for a quantum description of a superconducting ring, a model consisting of two interacting particles on a loop (a one-dimensional ring) is obtained by solving the two-particle Schrodinger's equation:

$$\frac{-\hbar^2}{2m}(\nabla_1^2+\nabla_2^2)\psi(r_1,r_2)+V(|r_1-r_2|)\psi(r_1,r_2)=E\psi(r_1,r_2).$$

In this equation $r_1$ corresponds with the position of the first particle and $r_2$ corresponds with position of the second particle. Hence, the potential is a function of $|r_1-r_2|$, which corresponds to how far the two particles are from each other.

In the presence of an attractive potential V ($|r_1-r_2|$) in terms of a center-of-mass and a relative coordinate, it can be shown that the state of the loop is described by the centerof-mass angular momentum states |L>. Accordingly, in the presence of an external electric field, the center-of-mass part of the Hamiltonian can be written as $$\hat{\mathcal{H}} = \frac{1}{2m^*}-(\hat{p}-q^*A(r,t))^2+q^*U(r,t),$$

where A(r, t) and U(r, t) are the vector and scalar potentials, respectively, with the charge q*=2q and the mass m*=2m. Under the dipole approximation, A(r, t)≈A(t) and performing a gauge transformation with A(r, t)≈A(t), the Hamiltonian reads $$\hat{\mathcal{H}} = \frac{\hat{p}^2}{2m} - qr \cdot \mathcal{E}(t),$$

where E(t) is the electric field. Assuming an in-plane electric field along the x-direction, as depicted in FIG. 3, the Hamiltonian becomes $$\hat{\mathcal{H}} = \frac{\hat{p}^2}{2m} - qR\mathcal{E}_x(t)\cos\phi.$$

As indicated by the cosine term in this equation, the presence of the electric field breaks the cylindrical symmetry of the ring, analogous to the cosine term arising from Josephson junctions in prior art qubit implementations. Due to the anharmonicity of the energy spectrum, one can isolate a two-level system consisting of the angular momentum states |0> and |1>. At the degeneracy point, achieved by a constant magnetic flux bias $\Phi_{ex}=\Phi_0/2$, the electric field couples the two states |0> and |1> resulting in an anticrossing behavior, as shown in FIG. 4, where the eigenstates are the symmetric and anti-symmetric superpositions. Accordingly, a one-dimensional ring subjected to an in-plane electric field—possibly with the help of a gate structure—behaves in a way similar to an rf-SQUID qubit (a superconducting loop interrupted by a Josephson junction). Furthermore, at very low temperature (in the order of few mK), the one-dimensional model is a valid description of a microscopic superconducting ring since all the Cooper pairs condense in the same state and all the degrees of freedom are frozen.

FIG. 5 shows an alternative embodiment of a qubit in accordance with embodiments of the disclosed technology. This experimental setup comprises a magnetic field generator for applying a magnetic field component $B_a^z$ orthogonal to the plane of the ring (only the resulting magnetic field component is shown for simplicity of the drawing).

Figure 6A:
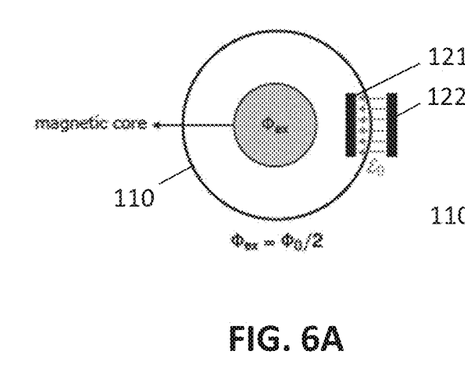
FIGS. 6A and 6B are two schematic drawings of a qubit with different thicknesses of the superconductive ring, in accordance with embodiments of the disclosed technology.
Figure 6B:
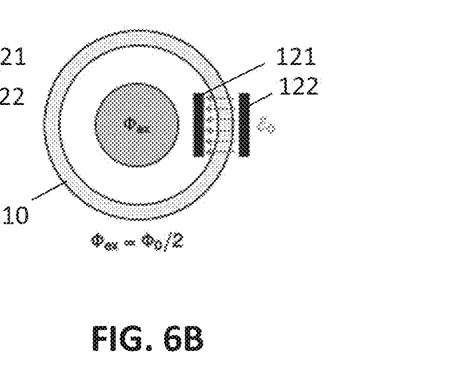

In FIGS. 6A and 6B the qubit comprises a one-dimensional superconducting loop pierced by a cylindrical core, to which the external magnetic field is confined.

In FIGS. 5, 6A and 6B the electric field generator comprises a first gate inside the ring and a second gate outside the ring. The in-plane electric field, arising from the gate voltage, is applied locally to suppress the density of superconducting electrons; hence, imitating the effect of interrupting the superconductor with an insulator to form a Josephson junction. Hence, a phase-slip center is introduced in the ring (a point where the order parameter of the GL equations goes to zero allowing for a discontinuous phase jump).

In embodiments of the disclosed technology the difference between the outer diameter and the inner diameter of the ring may be smaller than the GL coherence length of the superconductor under consideration. An example thereof is illustrated in FIG. 6A. In FIG. 6B the difference between the outer diameter and the inner diameter of the ring is larger than in FIG. 6A.

In the following paragraphs the effect of a uniform electric field and the effect of a local electric field in the plane of a superconducting ring is further discussed. To model the evolution of the density of superconducting electrons in response to applied electric and magnetic fields, the time-dependent Ginzburg Landau (GL) equation $$\frac{\hbar^2}{2m\mathcal{D}}\left(\frac{\partial}{\partial t}+i\frac{q}{\hbar}V\right)\Psi + \frac{1}{2m}(i\hbar\nabla-qA)^2\Psi - |\alpha|\Psi + \beta|\Psi|^2\Psi = 0,$$

is employed, where D is a phenomenological diffusion parameter, V is the scalar potential and the charge q=2e with e<0. The second GL equation comes from Ampere's law $$\nabla \times B = \mu_o J,$$

where the total current can be decomposed into two contributions, normal and superconducting. Accordingly, the second GL equation reads $$\nabla \times \nabla \times A = \mu_o(J_s+J_a),$$

with the supercurrent given by $$J_s = \frac{q}{2im^*}(\Psi^*\nabla\Psi - \Psi\nabla\Psi^*) - q^2|\Psi|^2 A$$
$$= \frac{q}{m^*}|\Psi|^2(\hbar\nabla\theta - qA),$$

where θ is the phase of the order parameter defined as $\psi=|\psi|e^{i\theta}$ whereas the normal component is given by $$J_a = \sigma E = \sigma\left(-\nabla V - \frac{\partial A}{\partial t}\right).$$

Substituting with the current expressions, the second GL equation can be put in the form $$\frac{1}{\mu_o}\nabla \times \nabla \times A = \frac{q}{m^*}|\Psi|^2(\hbar\nabla\theta - qA) - \sigma\left(\nabla V + \frac{\partial A}{\partial t}\right).$$

The two GL equations can be cast in a more transparent form by using dimensionless units. The space coordinates are scaled by the London penetration depth $\lambda_L$ and the time is scaled by the ratio between the Ginzburg-Landau coherence length and the diffusion parameter $\xi_{GL}^2/D$. Furthermore, the order parameter is normalized by its equilibrium value $|\psi_\infty|=|\alpha|/\beta$. The first GL equation, then, reads $$\left(\frac{\partial}{\partial t}+i\kappa V\right)\psi = -\left(\frac{i}{\kappa}\nabla+A\right)^2\psi + (1-|\psi|^2)\psi.$$

Similarly, the second GL equation can be rewritten as $$\nabla \times \nabla \times A = \frac{1}{2i\kappa}(\psi^*\nabla\psi - \psi\nabla\psi^*) - |\psi|^2 A - \sigma\left(\nabla V + \frac{\partial A}{\partial t}\right).$$

In the following paragraphs a general case of a one-dimensional superconducting loop with a radius R in an electrical field $E_a = E_a^x \hat{x} + E_a^y \hat{y}$, or in polar coordinates $E_a = E_a^r \hat{r} + E_a^\Phi \hat{\Phi}$. The ring is placed in a perpendicular homogeneous magnetic field $B_a = B_a^z \hat{z}$, or in terms of the vector potential $$A_a = A_\Lambda^\phi \hat{\phi} = \frac{B_a^z r}{2} \hat{\phi}.$$

For this one-dimensional model, the corrections to the vector potential can be ignored, that is there is no self-inductance ($A=\lambda_a$ and $B=B_a$) and the subscript will be dropped henceforth.

Furthermore, instead of solving Ampere's law, the continuity equation $$\nabla \cdot J = 0,$$

explicitly, one can write $$\frac{\partial J_n^\phi}{\partial \phi} = \frac{\partial J_s^\phi}{\partial \phi}.$$

Writing the supercurrent expression explicitly results in $$\frac{\sigma}{R}\frac{\partial^2 V}{\partial \phi^2} = \frac{\partial}{\partial \phi}\left[\frac{1}{2i\kappa R}\left(\psi^*\frac{\partial}{\partial \phi}\psi - \psi\frac{\partial}{\partial \phi}\psi^*\right) - |\psi|^2 A^\phi\right].$$

The scalar potential can be separated into an induced and applied one $V = V_a + V_i$; hence, one can write $$\sigma\frac{\partial^2 V_i}{\partial \phi^2} = -\sigma\frac{\partial^2 V_a}{\partial \phi^2} + \frac{\partial}{\partial \phi}\left[\frac{1}{2i\kappa}\left(\psi^*\frac{\partial}{\partial \phi}\psi - \psi\frac{\partial}{\partial \phi}\psi^*\right) - |\psi|^2 A^\phi\right].$$

The first GL equation can be rewritten as:

$$\frac{\partial}{\partial t}\psi = -i\kappa V\psi - \left(\frac{i}{\kappa}\nabla + A\right)^2\psi + (1-|\psi|^2)\psi$$

$$= -i\kappa V\psi + \frac{1}{\kappa^2}\nabla^2\psi - |A|^2\psi - \frac{i}{\kappa}A\cdot\nabla\psi - \frac{i}{\kappa}\nabla(A\psi) + (1-|\psi|^2)\psi$$

$$= -i\kappa V\psi + \frac{1}{\kappa^2}\nabla^2\psi - |A|^2\psi - \frac{i}{\kappa}A\cdot\nabla\psi - \frac{i}{\kappa}$$

$$(\nabla \cdot A)\psi - iA\cdot\nabla\psi + (1-|\psi|^2)\psi$$

$$= -i\kappa V\psi + \frac{1}{\kappa^2}\nabla^2\psi - |A|^2\psi - 2\frac{i}{\kappa}A\cdot\nabla\psi + (1-|\psi|^2)\psi$$

$$= -i\kappa V\psi + \frac{1}{\kappa^2 R}\frac{\partial \psi}{\partial \phi^2} - (A^\phi)^2\psi - \frac{2i}{R\kappa}A^\phi\frac{\partial \psi}{\partial \phi} + (1-|\psi|^2)\psi,$$

To sum up, the two equations to be solved are $$\frac{\partial}{\partial t}\psi = -i\kappa V\psi - \left(i\frac{1}{\kappa R}\frac{\partial}{\partial \phi} + A^\phi\right)^2\psi + (1-|\psi|^2)\psi, \text{ and}$$

$$\sigma_0\frac{\partial^2 V_i}{\partial \phi^2} = -\sigma_0\frac{\partial^2 V_a}{\partial \phi^2} + \frac{\partial}{\partial \phi}\left[\frac{1}{2i\kappa}\left(\psi^*\frac{\partial}{\partial \phi}\psi - \psi\frac{\partial}{\partial \phi}\psi^*\right) - |\psi|^2 A^\phi\right].$$

In the following sections, various cases corresponding to different geometries of the applied electric field are addressed. Furthermore, it is assumed that the radius is equal to the London penetration depth ($R=\lambda_L$), the dimensionless conductivity is equal to unity ($\sigma_0 = 1$), and the GL parameter $\kappa = 1$. The invention is, however, not limited to thereto.

In this section, a loop placed in a homogeneous perpendicular magnetic field in the absence of an applied electric field is considered. Accordingly, $E_a = 0$ and $V_a = 0$. However, the induced potential $V_i \neq 0$ due to the process of vortex formation. Consequently, the GL equations become $$\frac{\partial}{\partial t}\psi = -iV_i\psi - \left(i\frac{\partial}{\partial \phi} + A^\phi\right)^2\psi + (1-|\psi|^2)\psi, \text{ and}$$

$$\frac{\partial^2 V_i}{\partial \phi^2} = \frac{\partial}{\partial \phi}\left[\frac{1}{2i}\left(\psi^*\frac{\partial}{\partial \phi}\psi - \psi\frac{\partial}{\partial \phi}\psi^*\right) - |\psi|^2 A^\phi\right].$$

Figure 7:
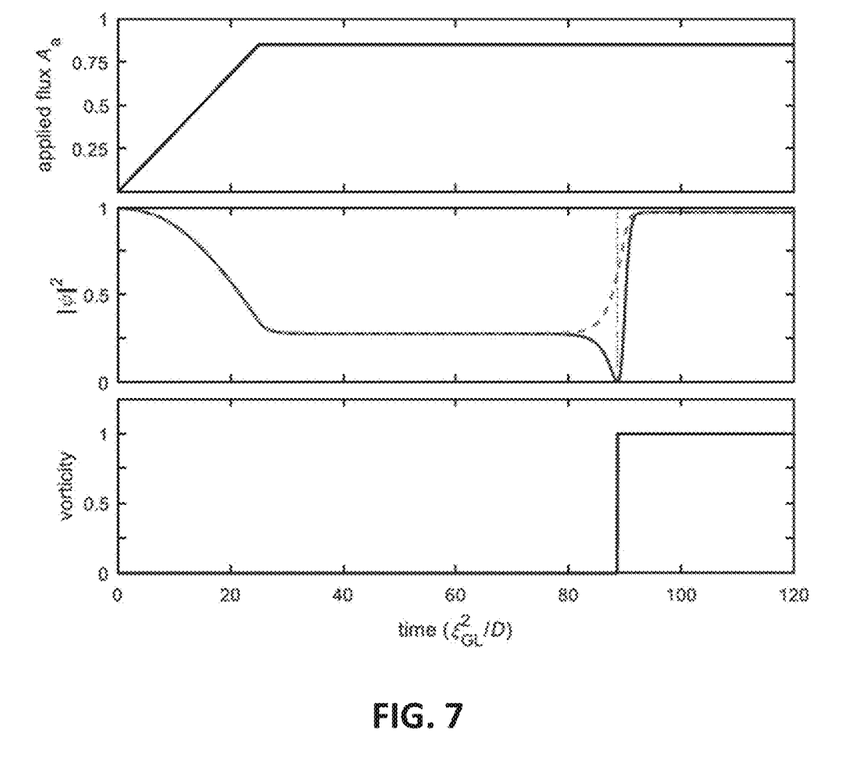
FIG. 7 are graphs showing the applied flux, and the resulting density and vorticity, for a qubit in accordance with embodiments of the disclosed technology.

FIG. 7 shows the resulting graphs. The top graph shows a ramp up of the magnetic field in time. From the graphs it can be seen that the density decreases to zero and that at zero a jump in the vorticity occurs. At that point the flux state changes from zero to 1. In the density graph the dotted line shows the maximum density and the fixed line shows the minimum density.

Figure 8:
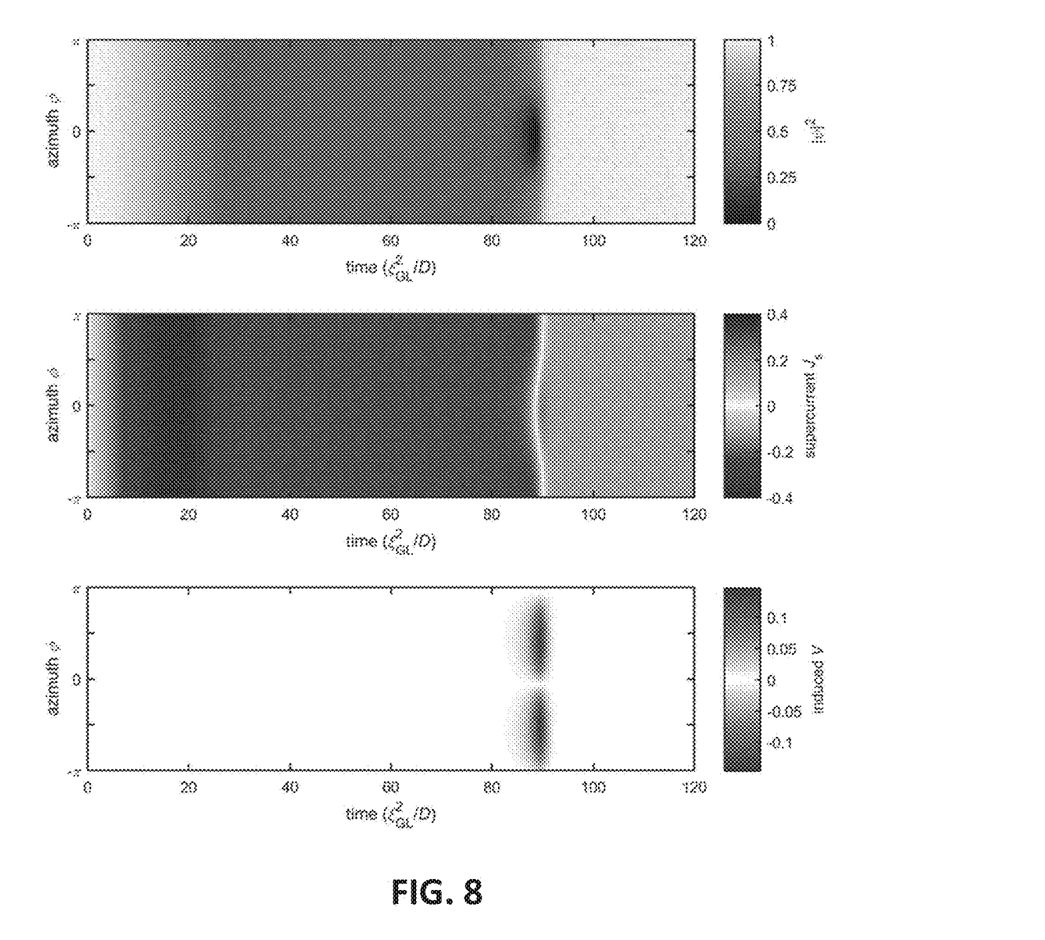
FIG. 8 shows graphs illustrating the density, the supercurrent and the induced voltage in function of time and in function of the angle $\Phi$, for a qubit in accordance with embodiments of the disclosed technology.

The graphs in FIG. 8 respectively show the density, the supercurrent $J_s$ and the induced voltage in function of time (the x-axis) and in function of the angle $\Phi$ (the y-axis). At the moment of the jump in vorticity, the density along the y-axis starts from one, decreases to zero, and then goes back up again. At the zero point the current goes from being negative to being positive. Similarly, the induced voltage goes from being positive to being negative in function of the angle $\Phi$ at the moment of the jump in vorticity.

Figure 9:
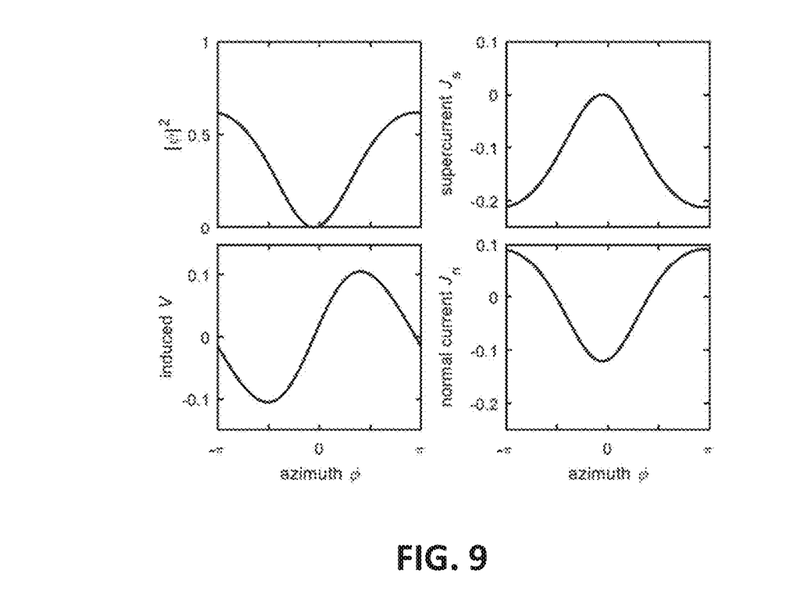
FIG. 9 shows four graphs. In clockwise order the density of the superconducting electrons, the supercurrent $J_s$, the induced voltage V, and the normal current $J_n$, in function of the angle $\Phi$, at the moment of the jump in vorticity for a qubit in accordance with embodiments of the disclosed technology are shown.

This is also illustrated in FIG. 9 of which the graphs show in clockwise order the density of the superconducting electrons, the supercurrent $J_s$, the induced voltage V, and the normal current $J_n$, in function of the angle $\Phi$, at the moment of the jump in vorticity.

In the next sections the effect of a uniform radial electric field on a one-dimensional loop and of a uniform electric field on a one-dimensional loop are theoretically discussed.

Uniform in-plane gating of a superconducting ring with a radius R in a perpendicular homogeneous magnetic field $b_a^z$ is illustrated in FIG. 3. The electric field is applied uniformly along the x-direction ($E_a = \varepsilon_0 \hat{x}$). In polar coordinates this equation can be written as:

$$E_a = E_a^r \hat{r} + E_a^\phi \hat{\phi}.$$

$$= \varepsilon_0 \cos\phi \hat{r} - \varepsilon_0 \sin\phi \hat{\phi}.$$

The corresponding scalar potential is obtained using $E = -\nabla V$ to be $$V_a(r,\phi) = -r\varepsilon_0 \cos\phi,$$

with the constant of integration set to zero for a symmetrically applied gate voltage—that is $V_g/2$ to one of the parallel plates and $-V_g/2$ to the other.

Consequently, the first GL equation reads $$\frac{\partial}{\partial t}\psi = -iV\psi - \left(i\frac{\partial}{\partial\phi} + A^\phi\right)^2\psi + (1-|\psi|^2)\psi, \text{ where}$$

$$V = V_a + V_i = -R\varepsilon_0\cos\phi + V_i.$$

To obtain the second GL equation, it should be noted that $$\frac{\partial^2 V_a}{\partial\phi^2} = -R\varepsilon_0\frac{\partial^2\cos\phi}{\partial\phi^2} = R\varepsilon_0\cos\phi = -V_a.$$

Accordingly, the second GL equation becomes $$\frac{\partial^2 V_i}{\partial\phi^2} = V_a + \frac{\partial}{\partial\phi}\left[\frac{1}{2i}\left(\psi^*\frac{\partial}{\partial\phi}\psi - \psi\frac{\partial}{\partial\phi}\psi^*\right) - |\psi|^2 A^\phi\right].$$

Figure 10A:
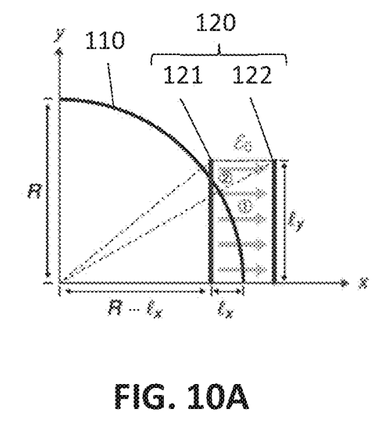
FIGS. 10A and 10B schematically show examples of local in-plane gating of a superconducting ring, in accordance with embodiments of the disclosed technology.
Figure 10B:
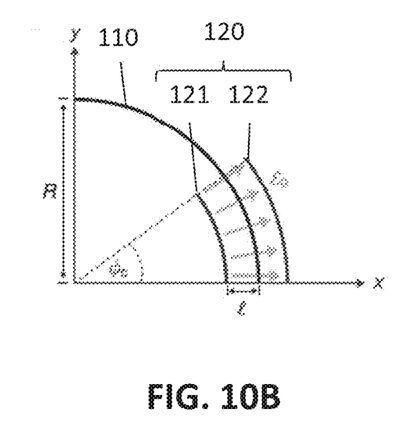
Figure 11A:
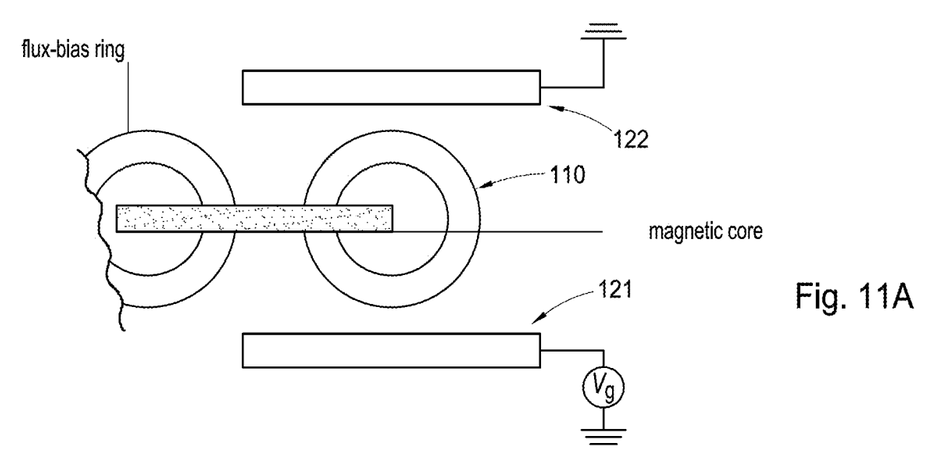
FIGS. 11A and 11B are schematic drawings of an array of stacked rings, top view and side view, respectively, in accordance with embodiments of the disclosed technology.
Figure 11B:
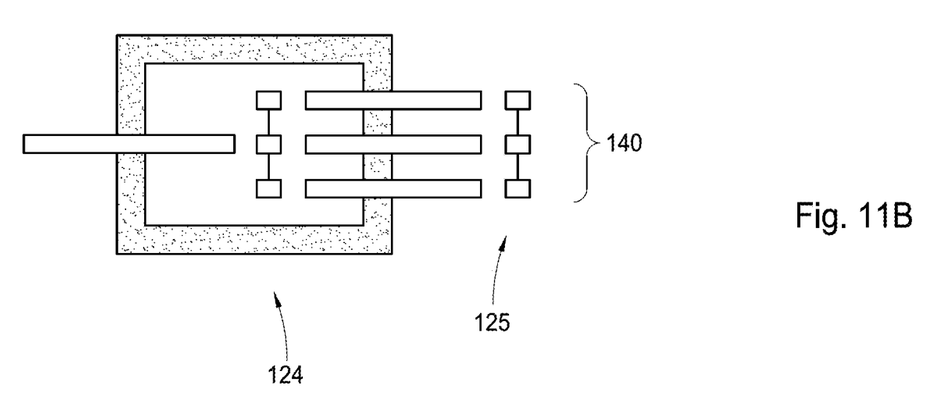

Examples of local in-plane gating of a superconducting ring, in accordance with embodiments of the disclosed technology are schematically illustrated in FIGS. 10A and 10B. Only a quarter of the ring is drawn. The ring has a radius R. In FIG. 10A the electric field is applied locally along the x-direction and in FIG. 10B the electric field is radially outward.

In embodiments of the disclosed technology different quantum rings may be build next to each other in some array or other structure 140. In such an array or structure 140 these rings are able to communicate with one another. In embodiments of the disclosed technology the quantum rings may be arranged in a 3D-structure thereby forming a qubit structure. The rings may be stacked on top of each other.

In embodiments of the disclosed technology the electric field generators of the qubits may comprise first and second gates. The gates of the qubits which are stacked on top of each other may be interconnected forming pillars of first gates 124 and pillars of second gates 125.

In embodiments of the disclosed technology the qubit may be integrated in a transformer structure as illustrated in FIG. 1. This allows to read the qubit state through the output ring and to initialize the qubit through the input ring. Other prior art interfaces of flux qubits and rf-SQUIDS may also be used. An example of such an implementation is explained in US2009079494A1.

In a second aspect embodiments of the disclosed technology relate to a method of generating coupled flux states in a superconducting ring. The method comprises:
applying a magnetic field component orthogonal to the ring and at least crossing the ring hole,
and applying an electrical field in a plane of the superconducting ring over at least part of the ring.

In summary, the primary advantage of a qubit in accordance with embodiments of the disclosed technology, compared to the Josephson junction, is the Electrical tunability of the qubit transition frequency. In the case of a Josephson junction, once the device is fabricated, the transition frequency of the qubit cannot be detuned. In prior art devices this difficulty may be circumvented by replacing a single Josephson junction with a loop including two Junctions; hence, the effective Josephson energy is modified based on the magnetic flux enclosed in this loop. However, this solution results in a high sensitivity to magnetic noise specially where more than one qubits are included. A qubit in accordance with embodiments of the disclosed technology, on the other hand, allows for tuning the transition frequency by changing the electric field of the electric field generator. This may be done by changing the gate voltage which is expected to improve the coherence time of the qubits.

What is claimed is:

1. A qubit comprising:
a superconducting ring around a hole;
an electric field generator adapted for applying an electric field in a plane of the superconducting ring over at least part of the superconducting ring; and
a magnetic field generator adapted for applying a magnetic field component orthogonal to the plane of the superconducting ring such that the magnetic field component at least crosses the hole of the ring,
wherein the superconducting ring is a junctionless ring that does not have a Josephson junction,
wherein the electric field generator comprises a first gate and a second gate that are positioned such that at least a part of the superconducting ring is located between the first gate and the second gate, and wherein the electric field generator is adapted for applying a bias voltage between the first gate and the second gate, and
wherein the first gate is located inside the superconducting ring and the second gate is located outside the superconducting ring.

2. The qubit according to claim 1, wherein the first gate is located at a first outer side of the superconducting ring and the second gate is located at a second outer side of the superconducting ring.

3. The qubit according to claim 1, wherein the electric field generator is adapted for tuning the applied electric field.

4. The qubit according to claim 1, wherein the superconducting ring is circular.

5. The qubit according to claim 1, wherein a thickness between inside and outside of the superconducting ring is smaller than or equal to a Ginzburg-Landau coherence length of the superconducting ring.

6. The qubit according to claim 1, wherein the superconducting ring comprises a type 1 superconductor.

7. The qubit according to claim 1, wherein the qubit comprises a magnetic core through the hole of the superconducting ring, and wherein the magnetic field generator is adapted for confining the magnetic field in the magnetic core.

8. A qubit structure comprising a plurality of qubits according to claim 1, wherein the qubits are organized in an array.

9. The qubit structure according to claim 8, comprising a plurality of arrays wherein the qubits of different ones of the arrays are stacked on top of each other.

10. The qubit structure according to claim 9, wherein the electric field generators comprise first and second gates, wherein the first gates are stacked on top of each other and are interconnected, and wherein the second gates are stacked on top of each other and are interconnected, such that pillars of first gates and pillars of second gates are formed.

11. A method of generating coupled flux states in a superconducting ring, the method comprising applying a magnetic field component orthogonal to the ring and at least crossing the ring hole and applying an electrical field, by an electric field generator, in a plane of the superconducting ring over at least part of the ring, wherein the superconducting ring is a junctionless ring that does not have a Josephson junction, wherein the electric field generator comprises a first gate and a second gate that are positioned such that at least a part of the superconducting ring is located between the first gate and the second gate, and wherein the electric field generator is adapted for applying a bias voltage between the first gate and the second gate, and wherein the first gate is located inside the superconducting ring and the second gate is located outside the superconducting ring.

* * * * *

UNITED STATES PATENT AND TRADEMARK OFFICE
CERTIFICATE OF CORRECTION

PATENT NO. : 11,055,625 B2
APPLICATION NO. : 16/289345
DATED : July 6, 2021
INVENTOR(S) : Ahmed Kenawy Page 1 of 1

It is certified that error appears in the above-identified patent and that said Letters Patent is hereby corrected as shown below:

In the Specification

In Column 1, Line 40, delete "$\phi$" and insert -- $\phi_0$ --.

In Column 7, Line 65, delete "W." and insert -- $\psi$. --.

In Column 8, Line 34 (approx.), delete "($\phi_{ex}$" and insert -- $\phi_{ex}$ --.

In Column 9, Line 36, delete "$\phi_0/2$," and insert -- $\phi_0/2$ --.

In Column 11, Line 21, delete "$\lambda_a$" and insert -- A$_a$ --.

In Column 11, Line 44 (approx.), delete "V$_a$" and insert -- V$_\mathbf{a}$ --.

In Column 11, Line 64 (approx.), delete "$\frac{1}{\kappa^2 R}\frac{\partial \psi}{\partial \phi^2}$" and insert -- $\frac{1}{\kappa^2 R^2}\frac{\partial^2 \psi}{\partial \phi^2}$ --.

In Column 12, Line 54, delete "b$_a^Z$" and insert -- B$_a^Z$ --.

Signed and Sealed this
Fifth Day of October, 2021

Drew Hirshfeld
*Performing the Functions and Duties of the
Under Secretary of Commerce for Intellectual Property and
Director of the United States Patent and Trademark Office*